United States Patent [19]

Hwang et al.

[11] Patent Number: 5,786,265
[45] Date of Patent: Jul. 28, 1998

[54] METHODS OF FORMING INTEGRATED SEMICONDUCTOR DEVICES HAVING IMPROVED CHANNEL-STOP REGIONS THEREIN, AND DEVICES FORMED THEREBY

[75] Inventors: Min-wk Hwang; Hung-mo Yang, both of Kyungki-do; Jae-ho Kim, Seoul; Won-taek Choi; Won-cheol Hong, both of Kyungki-do, all of Rep. of Korea

[73] Assignee: Samsung Electronics Co., Ltd., Suwon, Rep. of Korea

[21] Appl. No.: 647,874

[22] Filed: May 9, 1996

[30] Foreign Application Priority Data

May 12, 1995 [KR] Rep. of Korea ............... 1995-11767
Dec. 20, 1995 [KR] Rep. of Korea ............... 1995-52730

[51] Int. Cl.$^6$ ............................................. H04L 21/76
[52] U.S. Cl. ............................. 438/450; 438/449; 438/451; 438/298; 438/527
[58] Field of Search ...................... 437/69, 70, 72, 437/73, 28; 438/449, 450, 526, 297, 298, 451, 527

[56] References Cited

U.S. PATENT DOCUMENTS

| | | | |
|---|---|---|---|
| 4,794,565 | 12/1988 | Wu et al. | 365/185 |
| 5,041,886 | 8/1991 | Lee | 357/235 |
| 5,235,544 | 8/1993 | Caywood | 365/185 |
| 5,439,835 | 8/1995 | Gonzalez | 438/298 |
| 5,514,889 | 5/1996 | Cho et al. | 257/316 |
| 5,556,798 | 9/1996 | Hong | 437/70 |

FOREIGN PATENT DOCUMENTS

| | | | |
|---|---|---|---|
| 0022856 | 2/1980 | Japan | 437/70 |
| 0241142 | 9/1989 | Japan | 437/70 |

*Primary Examiner*—Trung Dang
*Attorney, Agent, or Firm*—Myers, Bigel, Sibley & Sajovec

[57] ABSTRACT

Methods of forming semiconductor devices containing field oxide and channel-stop isolation regions therein include the steps of forming a plurality of first channel-stop isolation regions by implanting first conductivity type impurities at a first dose level into a face of a semiconductor substrate and then forming respective field oxide isolation regions at the locations where the first channel-stop isolation regions have been implanted. A conductive layer, which contacts active regions of the substrate and covers the field oxide isolation regions, is then patterned over the field oxide isolation regions to expose central portions of the upper surfaces of the field oxide isolation regions. The patterned conductive layer constitutes a landing pad layer which is preferably used as a mask during the formation of second channel-stop isolation regions in the substrate, by implanting first conductivity type impurities through the exposed upper surfaces of the field oxide isolation regions, into the centers of the first channel-stop isolation regions. During this step, the impurities are implanted at a higher dose and energy level so that the first and second channel-stop regions collectively form T-shaped channel-stop regions underneath respective field oxide isolation regions, when viewed in transverse cross-section. By reducing the concentration of the channel-stop impurities near the edges of the field oxide isolation regions and active regions, leakage currents can be reduced and refresh characteristics of memory devices can be improved by reducing the strength of parasitic electric fields in the substrate. However, by maintaining relatively high concentrations of the channel-stop impurities under the center of the field oxide isolation regions, electrical isolation of adjacent devices can be maintained at high levels.

8 Claims, 6 Drawing Sheets

METHODS OF FORMING INTEGRATED SEMICONDUCTOR DEVICES HAVING IMPROVED CHANNEL-STOP REGIONS THEREIN, AND DEVICES FORMED THEREBY

CROSS-REFERENCE TO RELATED APPLICATION

This application is related to application Ser. No. 08/647,341 entitled METHODS OF FORMING INTEGRATED SEMICONDUCTOR DEVICES HAVING IMPROVED ISOLATION REGIONS THEREIN, AND DEVICES FORMED THEREBY (Attorney Docket No. 5649-10), filed concurrently herewith, the disclosure of which is hereby incorporated herein by reference.

FIELD OF THE INVENTION

The present invention relates to semiconductor devices and fabrication methods, and more particularly to methods of forming semiconductor devices with electrical isolation regions therein, and devices formed thereby.

BACKGROUND OF THE INVENTION

Device isolation techniques play an important role in the design and performance of highly integrated semiconductor circuits such as nonvolatile memory devices having arrays of memory cells and peripheral devices for driving the memory cells. However, conventional device isolation techniques typically limit the degree to which integrated semiconductor circuits and field effect devices contained therein can be scaled to reduced dimensions without encountering short channel and narrow width effects. These effects can adversely influence device performance by causing fluctuations in threshold voltage and other device characteristics. To address these limitations, a device isolation technique which can be scaled without magnifying short channel and narrow width effects is required.

According to a conventional device isolation technique illustrated by FIGS. 1A–1B, channel-stop isolation regions 9 are first formed in a semiconductor substrate 1, prior to formation of field oxide isolation regions 11. In particular, FIG. 1A shows the step of implanting channel-stop impurities 7 into non-active areas of a semiconductor substrate 1, using a patterned silicon nitride layer 5 (on a pad oxide film 3) as a mask, to form corresponding channel-stop isolation regions 9. Then, as illustrated by FIG. 1B, portions of the pad oxide film 3 overlying the channel-stop isolation regions 9 are removed and then field oxide isolation regions 11 are formed by oxidizing the substrate 1. The patterned silicon nitride layer 5 is also removed from the face of the substrate 1 and then diffusion regions 13 are formed in the active regions of the substrate 1 by performing a shallow implant and diffusion of active region dopants, using the field oxide isolation regions 11 as a mask. However, because the step of forming the field oxide isolation regions 11 is performed at high temperatures of about 1000° C. for relatively long time periods, loss of impurities to the field oxide and lateral diffusion of the impurities from the channel-stop isolation regions 9 into the adjacent diffusion regions 13 and other active regions of the substrate 1 can occur. Unfortunately, this can degrade the electrical characteristics of devices formed in the active regions.

For example, in the event an N-channel field effect transistor is ultimately formed having an N-type drain region in a diffusion region 13 and a P-type dopant (e.g., boron) is used as a channel-stop impurity 7, lateral diffusion of the P-type dopant can occur during formation of the field oxide isolation regions 11. This lateral diffusion can exacerbate short channel and narrow width effects in field effect transistors. Lateral diffusion can also reduce the impurity concentration in the channel-stop isolation regions 9 which reduces the isolation capability of these regions 9 and thereby limits the degree to which integrated circuits can be more densely integrated. High concentrations of channel-stop impurities near the diffusion regions 13 can also cause the formation of strong electric fields in the substrate 1, which contributes to increased leakage currents and can deteriorate refresh characteristics of memory devices.

Thus, notwithstanding the prior art methods for forming channel-stop isolation regions, as illustrated by FIGS. 1A–1B, there still continues to be a need for an improved method of providing device isolation which can be scaled without increasing short channel and narrow width effects or reducing the device isolation capability.

SUMMARY OF THE INVENTION

It is therefore an object of the present invention to provide improved methods of forming integrated semiconductor devices containing electrical isolation regions therein, and devices formed thereby.

It is another object of the present invention to provide methods of forming integrated semiconductor devices containing nonvolatile memory devices of small unit cell size therein, and devices formed thereby.

It is a further object of the present invention to provide methods of forming integrated nonvolatile memory cell arrays having channel-stop regions of reduced lateral dimension, and arrays formed thereby.

It is still a further object of the present invention to provide methods of forming integrated nonvolatile memory cell arrays having channel-stop regions which provide high levels of electrical isolation, and arrays formed thereby.

These and other objects, features and advantages of the present invention are provided by initially implanting first channel-stop isolation impurities into a semiconductor substrate, prior to formation of field oxide isolation regions, and then implanting second channel-stop isolation impurities at a higher dose and energy through the field oxide isolation regions to form channel-stop regions of preferably T-shaped cross-section. These channel-stop isolation regions provide improved electrical isolation between adjacent devices and also reduce parasitic field effects which can degrade device performance. The preferred methods also include the steps of forming a patterned landing pad layer, which acts as an intermediate wiring contact layer, and then using it as an implantation mask during implantation of the second channel-stop impurities.

In particular, a method according to the present invention includes the steps of forming a plurality of first channel-stop isolation regions by implanting first conductivity type impurities at a first dose level into a face of a semiconductor substrate and then forming respective field oxide isolation regions at the locations where the first channel-stop isolation regions have been implanted. Next, a conductive layer, which contacts active regions of the substrate and covers the field oxide isolation regions, is patterned over the field oxide isolation regions to expose central portions of the upper surfaces of the field oxide isolation regions. The patterned conductive layer constitutes a landing pad layer which is then used as a mask during the formation of second channel-stop isolation regions in the substrate, by implanting first conductivity type impurities through the exposed upper surfaces of the field oxide isolation regions, into the centers of the first channel-stop isolation regions. During this step, the impurities are implanted at a higher dose and energy level so that the first and second channel-stop regions collectively form T-shaped channel-stop regions underneath respective field oxide isolation regions, when viewed in transverse cross-section.

Semiconductor devices such as field effect transistors, for example, are then preferably formed in active regions of the substrate. These active regions are preferably isolated from each other by the channel-stop isolation regions in addition to the respective field oxide isolation regions. By reducing the concentration of the channel-stop impurities near the edges of the field oxide isolation regions and active regions, leakage currents can be reduced and refresh characteristics of memory devices can be improved by reducing the strength of parasitic electric fields in the substrate. However, by maintaining relatively high concentrations of the channel-stop impurities under the center of the field oxide isolation regions, electrical isolation of adjacent devices can be maintained at high levels. The formation of the landing pad layer at an early point during the method also facilitates the formation of reliable low resistance electrical connections between subsequently formed wiring layers/electrodes and diffusion regions and other active regions in the substrate. Thus, the need to open deep vias in subsequently formed layers in order to contact the face of the substrate is reduced.

DESCRIPTION OF PREFERRED EMBODIMENTS

Figure 1A:
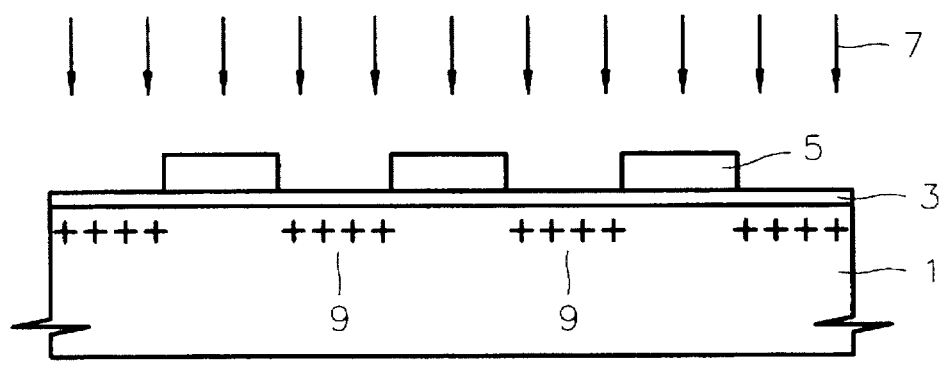
FIGS. 1A–1B illustrate schematic cross-sectional views of intermediate structures illustrating a method of forming a semiconductor device with field and channel-stop isolation regions therein, according to the prior art.
Figure 1B:
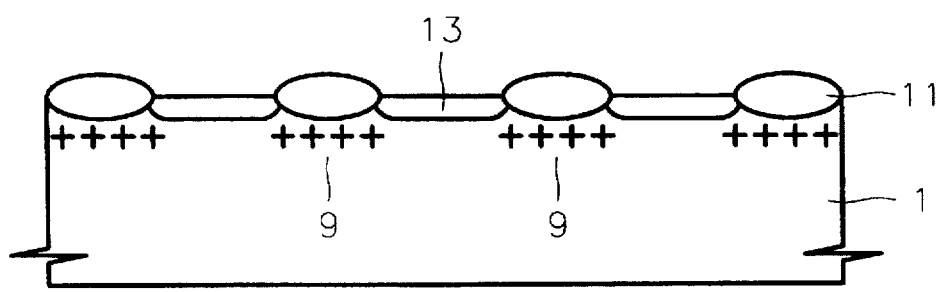

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type, however, each embodiment described and illustrated herein includes its complementary embodiment as well.

Referring now to FIGS. 2A–2C and 3A–3C, a preferred method of forming an integrated semiconductor device containing field and channel-stop isolation regions therein, according to a first embodiment of the present invention, will be described. In particular, for the case of a semiconductor device comprising a memory device or array, FIGS. 2A–2C can represent cross-section views taken in the direction of a word line (i.e., gate electrode) whereas FIGS. 3A–3C can represent cross-sectional views taken in a direction transverse to the word line. Thus, FIGS. 2A–2C and 3A–3C can represent orthogonal cross-sectional "slices" of an integrated array of memory cell devices.

Figure 2A:
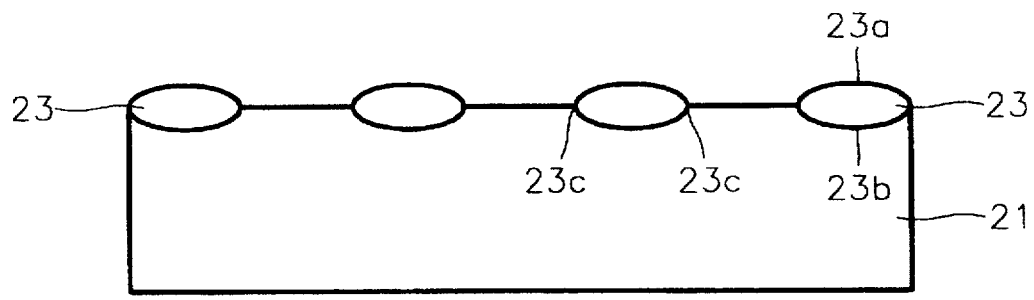
FIGS. 2A–2C and 3A–3C illustrate schematic cross-sectional views of intermediate structures illustrating a method of forming a semiconductor device with field and channel-stop isolation regions therein, according to a first embodiment of the present invention.
Figure 3A:
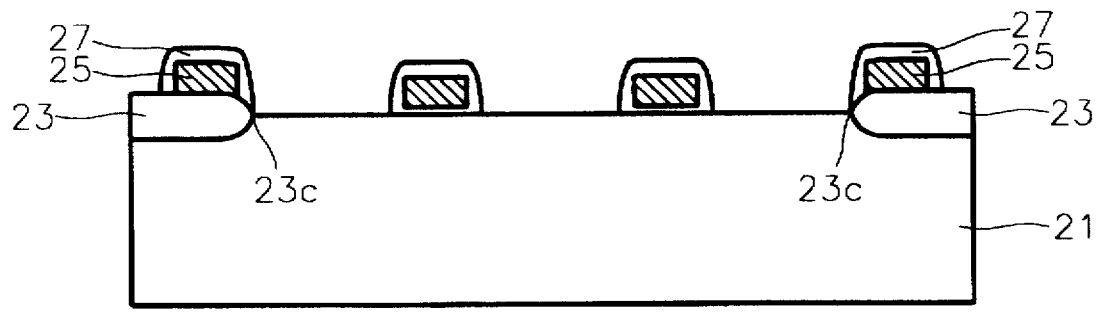

Referring now specifically to FIGS. 2A and 3A, relatively thick field oxide isolation regions 23 are preferably selectively formed at a face of a semiconductor substrate 21 of first conductivity type (e.g., P-type) using LOCOS or other conventional techniques. The formation of the field oxide isolation regions 23 also defines non-active regions in the semiconductor substrate 21, which extend underneath the isolation regions 23, and active regions which extend between adjacent isolation regions 23. These field oxide isolation regions 23 may be formed to have thicknesses of about 4000–6000 Å using relatively high temperature thermal oxidation growth techniques. During growth of the field oxide isolation regions 23, underlying portions of the substrate 21 are consumed. As illustrated best by FIG. 2A, the field oxide isolation regions 23 have uppermost faces 23a and lowermost faces 23b which are spaced from the face of the semiconductor substrate 21 and first and second opposing edges 23c which extend along and contact the face. As illustrated best by FIG. 3A, insulated gate electrodes are also preferably formed at respective locations at the face of the semiconductor substrate 21. These insulated gate electrodes preferably include a gate insulating region 27 (e.g., $SiO_2$) and a conductive gate region 25 which may comprise doped polycrystalline silicon. Diffusion regions (not shown) may also be formed in the substrate 21 as, among other things, source and drain regions of field effect transistors which extend between the gate electrodes.

Figure 2B:
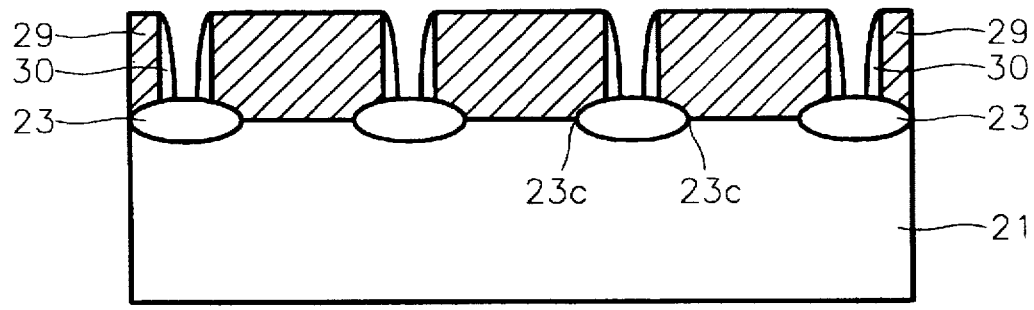
Figure 3B:
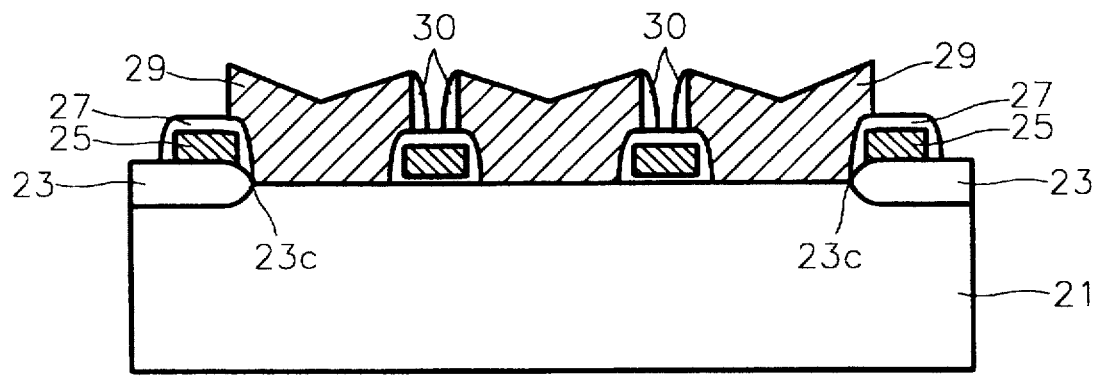

Referring now specifically to FIGS. 2B and 3B, a wiring layer is preferably formed on the face of the substrate and on the upper surface 23a of the field oxide isolation regions 23. This wiring layer is then defined as a landing pad layer 29 using photolithography and etching techniques. The landing pad layer 29, which contacts active regions of the substrate 21, facilitates the formation of reliable low resistance electrical connections between subsequently formed wiring layers/electrodes (e.g., a bit line of a memory device) and the diffusion and other active regions in the substrate 21. The step of forming a landing pad layer 29 as an intermediate layer to facilitate electrical contact between active regions in the substrate and upper level wiring layers is especially important in highly integrated circuits where poor step coverage through wiring vias of small area is typically a problem. This problem is compounded still further because of the potential for misalignment of masks during the formation of vias and other contact holes. To limit the occurrence of this problem, the landing pad layer 29 is formed in a self-aligned manner to the insulated gate electrodes and in contact with one or more active regions in the substrate, at an early stage in the formation of the semiconductor device. Accordingly, the need to open vias in subsequently formed layers in order to contact the face of the substrate is reduced.

Figure 2C:
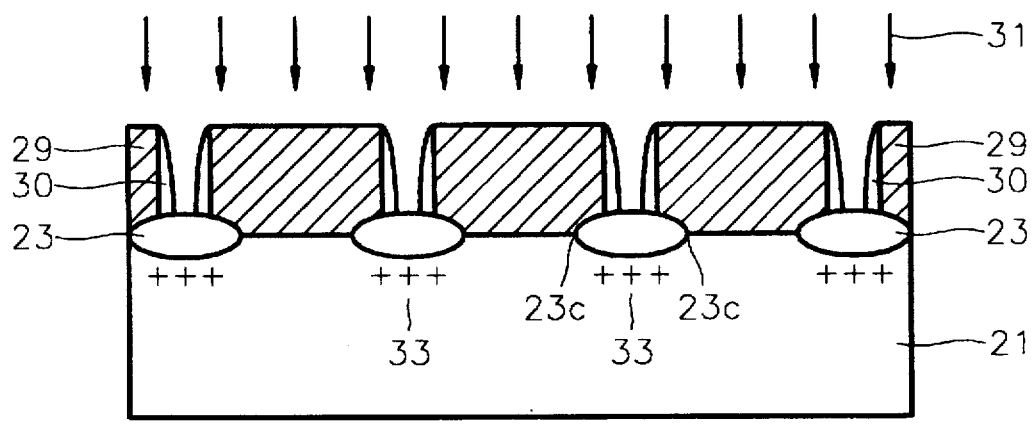
Figure 3C:
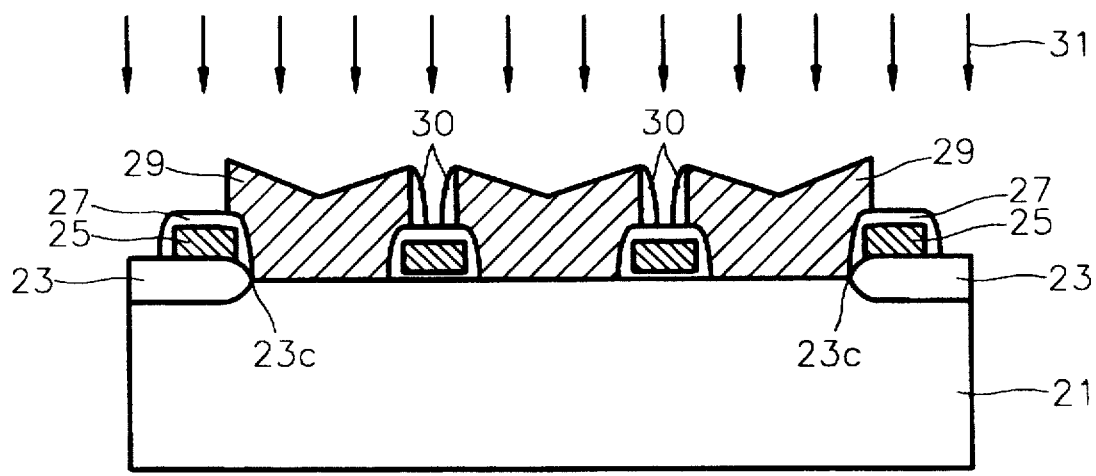

Referring next to FIGS. 2C and 3C, the landing pad layer 29 is also patterned to expose central portions of the upper surfaces of the field oxide isolation regions 23 so that channel-stop impurities 31 (e.g., P-type) can be implanted into the substrate 21 in a self-aligned manner to improve device isolation capability by limiting the lateral dimension of the channel-stop isolation regions 33. To further narrowly define the central portions of the upper surfaces of the field oxide isolation regions 23, sidewall spacers 30 may also be formed in the patterned openings in the landing pad layer 29. The channel-stop impurities are preferably implanted at sufficient energies in the range of 100–300 keV to penetrate the field oxide isolation regions 23 and form the channel-stop isolation regions 33, as illustrated. Because the channel-stop impurities are implanted into only the central portions of the upper surfaces of the field oxide isolation regions 23, which are spaced from the edges 23c or periphery thereof, the channel-stop isolation regions 33 do not extend laterally to the face of the substrate 21 or edges 23c. This preferably limits encroachment of the channel-stop isolation impurities 31 into the active regions of subsequently formed transistors located adjacent the field oxide isolation regions 23, even if high temperature processing steps are utilized. As described above, these active regions can include the source, drain and channel regions of nonvolatile field effect memory devices. By limiting lateral encroachment of the channel-stop isolation impurities, the breakdown voltages of devices such as nonvolatile memory devices can be improved and their effective channel width can be more accurately controlled to thereby provide improved scaling capability. Moreover, by limiting the formation of high concentrations of channel-stop impurities near the edges 23c of the field oxide isolation regions 23, leakage currents can also be reduced and refresh characteristics of memory devices can be improved by reducing the strength of parasitic electric fields in the substrate 21.

Figure 4A:
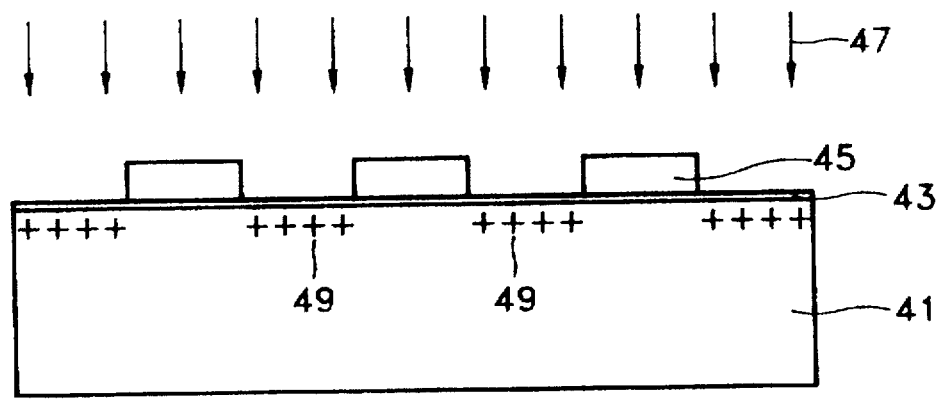
FIGS. 4A–4C illustrate schematic cross-sectional views of intermediate structures illustrating a method of forming a semiconductor device with field and channel-stop isolation regions therein, according to a second embodiment of the present invention.
Figure 4B:
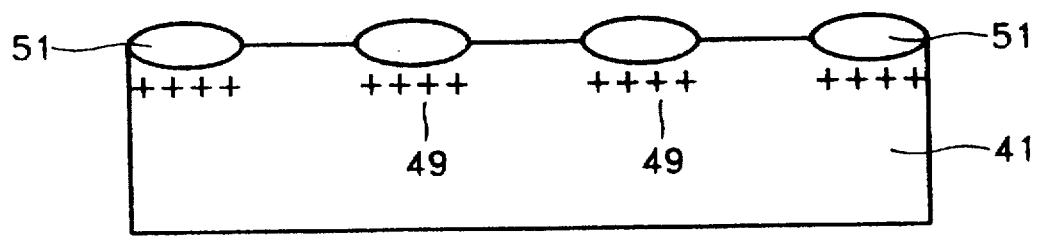
Figure 4C:
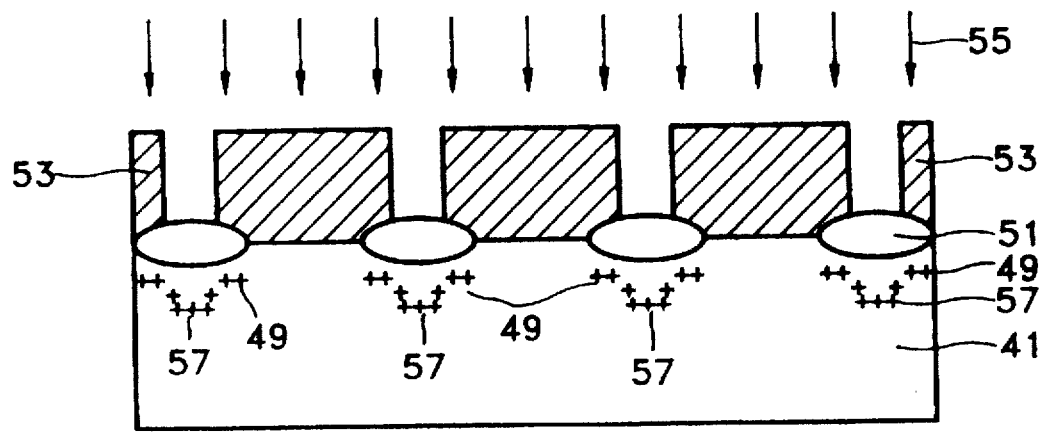

Referring now to FIGS. 4A–4C, a preferred method of forming T-shaped channel-stop isolation regions therein according to a second embodiment of the present invention will be described. In particular, a pad oxide film 43 and silicon nitride film 45 are sequentially formed on a face of a semiconductor substrate 41. The pad oxide film 43 is preferably formed to a thickness of about 200–300 Å by thermal oxidation techniques and then the silicon nitride film 45, which acts as an oxidation blocking layer, is formed thereon to a thickness of about 1300–1700 Å. The silicon nitride film 45 is then photolithographically patterned and etched to define openings and expose the pad oxide film 43. Impurities 47 of first conductivity type are then implanted into the substrate at a first dose level and energy level, using the patterned silicon nitride film 45 as a mask, to define a plurality of first channel-stop isolation regions 49. As illustrated by FIG. 4B, the exposed portions of the pad oxide film 43 are removed to expose the face of the substrate 41 and then relatively thick field oxide isolation regions 51 are formed at the exposed face.

Next, using similar techniques to those described with respect to FIGS. 2B–2C and 3B–3C, a landing pad layer 53 is formed and then patterned on the field oxide isolation regions 51 to define openings so that impurities of first conductivity type can again be implanted through the isolation regions 51 and into the first channel-stop isolation regions 49. However, in contrast to the steps for forming the first channel-stop isolation regions, the dose and/or energy levels of this second implanting step are greater than the dose and energy levels of the first implanting step, so that preferably deeper second channel-stop regions 57 having higher net first conductivity type impurity concentrations therein can be formed.

In particular, the dose and energy levels of the second implanting step are preselected to account for the greater thickness of the field oxide isolation regions 51 (relative to the thickness of the pad oxide film 43). The relative doses and energy levels are also preferably selected so that the first and second channel-stop regions will collectively form T-shaped channel-stop regions when viewed in transverse cross-section. As illustrated by FIG. 4C, these T-shaped channel-stop isolation regions preferably include relatively deep central portions defined by the second channel-stop regions 57 and shallower peripheral portions defined by the first channel-stop isolation regions 49. By forming T-shaped channel-stop regions with lower doped peripheral portions adjacent the bottom surface of the field oxide isolation regions 51 and higher doped central portions which extend deeper into the substrate 41, improved electrical isolation capability can be achieved. In particular, by reducing the concentration of the channel-stop impurities near the edges of the field oxide isolation regions 51 and active regions, leakage currents can be reduced and refresh characteristics of memory devices can be improved by reducing the strength of parasitic electric fields in the substrate 41. In addition, by maintaining relatively high concentrations of the channel-stop impurities under the center of the field oxide isolation regions, electrical isolation of adjacent devices such as field effect transistors and other devices can be maintained at a high level.

Figure 5:
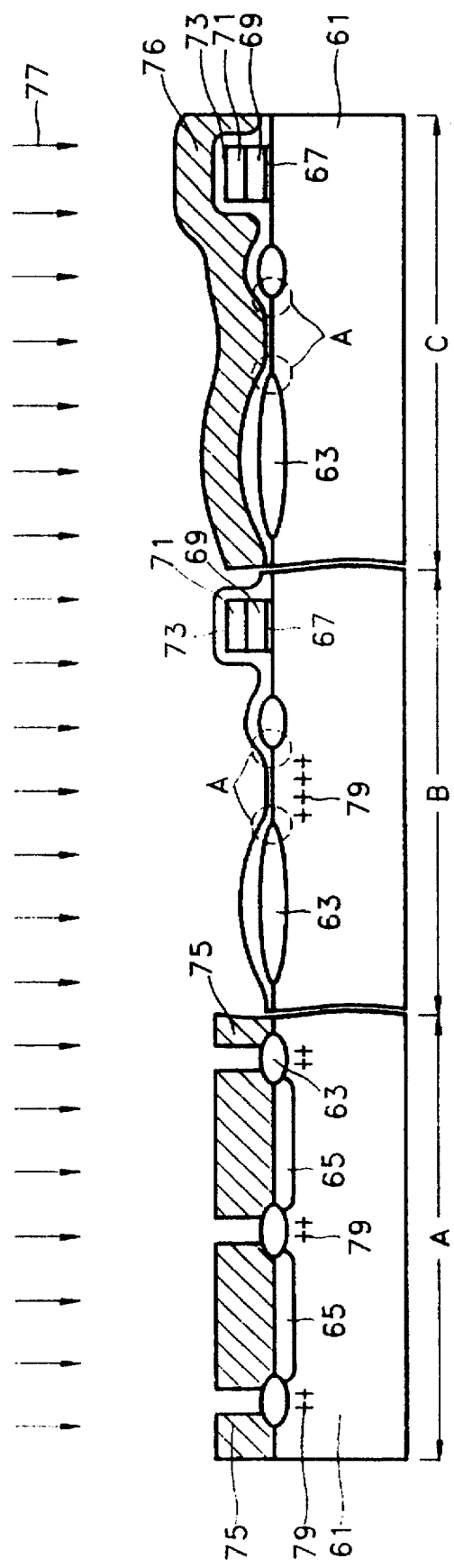
FIG. 5 illustrates a schematic cross-sectional view of an intermediate structure illustrating a method of forming a semiconductor device with field and channel-stop isolation regions therein, according to a third embodiment of the present invention.
Figure 6:
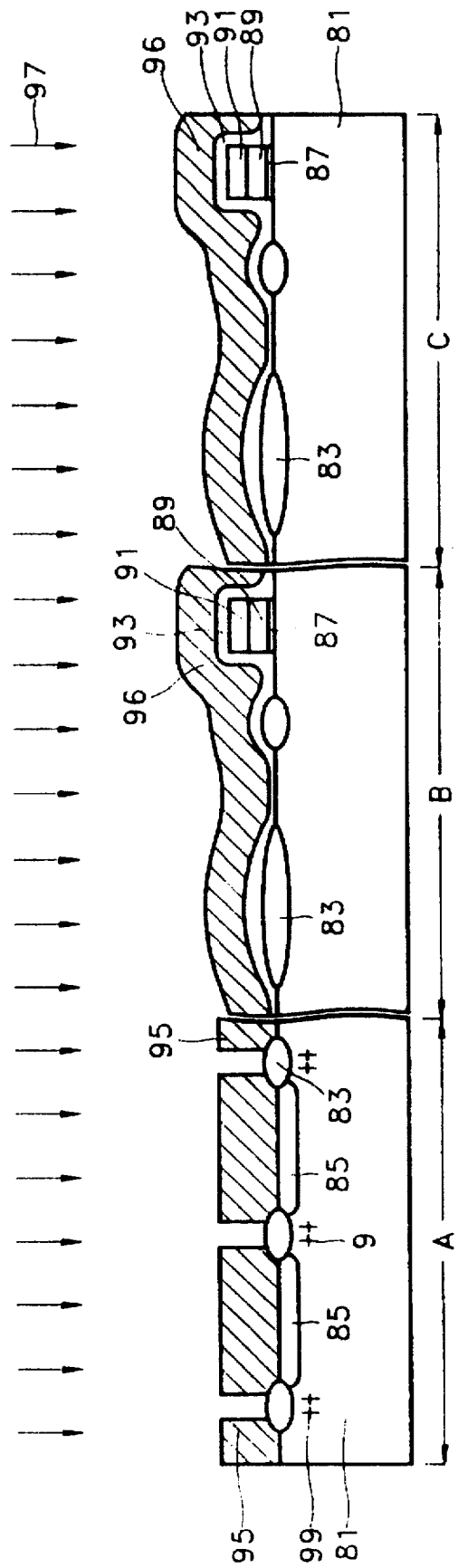
FIG. 6 illustrates a schematic cross-sectional view of an intermediate structure illustrating a method of forming a semiconductor device with field and channel-stop isolation regions therein, according to a fourth embodiment of the present invention.

Referring now to FIGS. 5 and 6, third and fourth embodiments of the present invention will be described. In particular, FIGS. 5–6 illustrate cross-sectional views of an integrated nonvolatile memory device containing a memory cell array portion (region A) and first and second peripheral circuit portions (regions B and C) for driving the memory cell array portion. Referring specifically to FIG. 5, the preferred memory device comprises a semiconductor substrate 61 of first conductivity type (e.g., P-type); field oxide isolation regions 63; diffusion regions 65 of second conductivity type (e.g. N-type) which may act as source and drain regions of an second conductivity type channel (e.g., N-channel) field effect transistor; channel-stop isolation regions 79 of first conductivity type; a landing pad layer 75; impurity blocking layer 76; gate insulating film 67; gate electrode 69; gate capping oxide 71; and oxide film 73 for forming oxide spacers.

According to a preferred method of forming the device of FIG. 5, an impurity blocking layer 76 is formed over the second peripheral portion (region C) to prevent the implantation of channel-stop impurities 77 therein, at the same time as the landing pad layer 75 is patterned. However, because the oxide film 73 may be relatively thin, channel-stop impurities may still be implanted into the substrate 61 in the first peripheral portion (region B), as shown by portion A at the edges of the field oxide isolation regions 63. Yet, as will be understood by those skilled in the art, such implantation may adversely degrade the electrical characteristics of devices formed in the first peripheral portion (region B), and in the second peripheral portion (region C) in the event the impurity blocking layer 76 is not patterned, as shown. Accordingly, in FIG. 6, an impurity blocking layer 96 is formed over both the first and second peripheral portions (regions B and C), at the same time as a landing pad layer 95 is patterned. Similar to the device of FIG. 5, the device of FIG. 6 also contains field oxide isolation regions 83; diffusion regions 85 of second conductivity type; channel-stop isolation regions 99 of first conductivity type; gate insulating film 87; gate electrode 89; gate capping oxide 91; and oxide film 73 for forming oxide spacers. Thus, in accordance with the embodiments of FIGS. 5–6, an impurity blocking layer can be formed at the same time as the landing pad layer in order to prevent degradation of device characteristics in peripheral portions of the device.

In accordance with the present invention as described more fully above, T-shaped channel-stop isolation regions having lower doped peripheral portions and higher doped central portions provide improved electrical isolation capability in semiconductor devices. By reducing the concentration of the channel-stop impurities near the edges of the field oxide isolation regions and active regions, leakage currents can be reduced and refresh characteristics of memory devices can be improved by reducing the strength of parasitic electric fields in the substrate. However, by maintaining relatively high concentrations of the channel-stop impurities under the center of the field oxide isolation regions, electrical isolation of adjacent devices can be maintained at high levels. These channel-stop isolation regions can also be easily formed in a self-aligned manner using a patterned landing pad layer as a mask, which reduces the number of photolithography steps that are needed to process the devices. The formation of the landing pad layer at an early point during the method also facilitates the formation of reliable low resistance electrical connections between subsequently formed wiring layers/electrodes and the diffusion and other active regions in the substrate. Thus, the need to open deep vias in subsequently formed layers in order to contact the face of the substrate is reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated semiconductor device containing channel-stop isolation regions therein, comprising the steps of:

forming a plurality of first channel-stop isolation regions of first conductivity type in a semiconductor substrate, by implanting first conductivity type impurities at a first dose level into respective locations at a face thereof;

forming a respective field oxide isolation region at each of the locations so that each of the field oxide isolation regions has an upper surface which is spaced from the face, first and second opposing edges which extend adjacent the face and a bottom surface which extends opposite one of the first channel-stop isolation regions;

patterning a layer on upper surfaces of the field oxide isolation regions to define openings therein which expose central portions of the upper surfaces and cover peripheral portions of the upper surfaces extending to respective first and second opposing edges;

forming sidewall spacers in the openings in the patterned layer;

forming a second channel-stop isolation region of the first conductivity type in a respective first channel-stop isolation region by implanting first conductivity type impurities at a second dose level into the exposed central portions of the upper surfaces of the field oxide isolation regions, using the patterned layer and sidewall spacers as an implant mask, so that each of the second channel-stop isolation regions extends adjacent the bottom surface of a respective field oxide isolation region;

forming a semiconductor device adjacent a first edge of a field oxide isolation region;

wherein the first dose level is less than the second dose level so that the net first conductivity type doping concentration of a first channel-stop isolation region is less than the net first conductivity type doping concentration of a second channel-stop isolation region therein;

wherein said step of forming a plurality of first channel-stop isolation regions is performed by implanting first conductivity type impurities at a first energy level;

wherein said step of forming second channel-stop isolation regions is performed by implanting first conductivity type impurities at a second energy level which is greater than the first energy level;

wherein the integrated semiconductor device is a non-volatile memory device containing a memory cell array portion and a peripheral circuit portion for driving the memory cell array portion, in the semiconductor substrate; and wherein said second channel-stop isolation regions forming step comprises implanting first conductivity type impurities through field oxide isolation regions in the memory cell array and peripheral circuit portions of the substrate simultaneously.

2. A method of forming an integrated semiconductor device containing channel-stop isolation regions therein, comprising the steps of:

forming a plurality of first channel-stop isolation regions of first conductivity type in a semiconductor substrate, by implanting first conductivity type impurities at a first dose level into respective locations at a face thereof;

forming a respective field oxide isolation region at each of the locations so that each of the field oxide isolation regions has an upper surface which is spaced from the face, first and second opposing edges which extend adjacent the face and a bottom surface which extends opposite one of the first channel-stop isolation regions;

patterning a layer on upper surfaces of the field oxide isolation regions to define openings therein which expose central portions of the upper surfaces and cover peripheral portions of the upper surfaces extending to respective first and second opposing edges;

forming sidewall spacers in the openings in the patterned layer;

forming a second channel-stop isolation region of the first conductivity type in a respective first channel-stop isolation region by implanting first conductivity type impurities at a second dose level into the exposed central portions of the upper surfaces of the field oxide isolation regions, using the patterned layer and sidewall spacers as an implant mask, so that each of the second channel-stop isolation regions extends adjacent the bottom surface of a respective field oxide isolation region;

forming a semiconductor device adjacent a first edge of a field oxide isolation region;

wherein the integrated semiconductor device is a non-volatile memory device containing a memory cell array portion and a peripheral circuit portion for driving the memory cell array portion, in the semiconductor substrate; and wherein said second channel-stop isolation regions forming step comprises implanting first conductivity type impurities through field oxide isolation regions in the memory cell array and peripheral circuit portions of the substrate simultaneously.

3. A method of forming an integrated semiconductor device containing channel-stop isolation regions therein, comprising the steps of:

forming a field oxide isolation region at a face of a semiconductor substrate of first conductivity type so that the field oxide isolation region has an upper surface which is spaced from the face and first and second opposing edges which extend adjacent the face;

forming a landing pad layer on the face of the substrate and on the upper surface of the field oxide isolation region so that the landing pad layer ohmically contacts the semiconductor substrate and covers the field oxide isolation region;

patterning the landing pad layer to expose a central portion of the upper surface of the field oxide isolation region and cover a peripheral portion of the upper surface extending to the first and second opposing edges;

forming a channel-stop isolation region of first conductivity type in the semiconductor substrate by implanting first conductivity type impurities into the exposed central portion of the upper surface, using the patterned landing pad layer as a mask, so that the channel-stop isolation region extends adjacent a bottom surface of the field oxide isolation region;

forming a semiconductor device in the semiconductor substrate so that an active region of the device is electrically connected to the patterned landing pad layer, adjacent the first edge of the field oxide isolation region; and forming an electrode to the semiconductor device on the patterned landing pad layer so that the electrode is electrically connected to the active region by the patterned landing pad layer.

4. The method of claim 3, wherein said field oxide isolation region forming step is preceded by the step of implanting first conductivity type impurities into the face of the semiconductor substrate at a predetermined dose level to form a first channel-stop isolation region; and wherein said channel-stop isolation region forming step comprises implanting first conductivity type impurities at a dose level greater than the predetermined dose level to form a second channel-stop isolation region in the first channel-stop isolation region.

5. The method of claim 4, wherein said step of implanting first conductivity type impurities at a predetermined dose level comprises implanting first conductivity type impurities at a first energy level; and wherein said step of implanting first conductivity type impurities at a dose level greater than the predetermined dose level comprises implanting first conductivity type impurities at a second energy level which is greater than the first energy level.

6. A method of forming an integrated semiconductor device containing channel-stop isolation regions therein, comprising the steps of:

forming a field oxide isolation region at a face of a semiconductor substrate of first conductivity type so that the field oxide isolation region has an upper surface which is spaced from the face and first and second opposing edges which extend adjacent the face;

forming a landing pad layer on the face of the substrate and on the upper surface of the field oxide isolation region so that the landing pad layer ohmically contacts the semiconductor substrate and covers the field oxide isolation region;

patterning the landing pad layer to expose a central portion of the upper surface of the field oxide isolation region and cover a peripheral portion of the upper surface extending to the first and second opposing edges;

forming a channel-stop isolation region of first conductivity type in the semiconductor substrate by implanting first conductivity type impurities into the exposed central portion of the upper surface, using the patterned landing pad layer as a mask, so that the channel-stop isolation region extends adjacent a bottom surface of the field oxide isolation region;

forming a semiconductor device in the semiconductor substrate, adjacent the first edge of the field oxide isolation region; and forming an electrode to the semiconductor device on the patterned landing pad layer so that the electrode is electrically coupled to the semiconductor device by the patterned landing pad layer.

7. The method of claim 6, wherein said field oxide isolation region forming step is preceded by the step of implanting first conductivity type impurities into the face of the semiconductor substrate at a predetermined dose level to form a first channel-stop isolation region; and wherein said channel-stop isolation region forming step comprises implanting first conductivity type impurities at a dose level greater than the predetermined dose level to form a second channel-stop isolation region in the first channel-stop isolation region.

8. The method of claim 7, wherein said step of implanting first conductivity type impurities at a predetermined dose level comprises implanting first conductivity type impurities at a first energy level; and wherein said step of implanting first conductivity type impurities at a dose level greater than the predetermined dose level comprises implanting first conductivity type impurities at a second energy level which is greater than the first energy level.

* * * * *